United States Patent
Kobayakawa

(10) Patent No.: US 9,030,096 B2
(45) Date of Patent: May 12, 2015

(54) LED MODULE

(71) Applicant: Rohm Co., Ltd., Kyoto (JP)

(72) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 35 days.

(21) Appl. No.: 13/738,063

(22) Filed: Jan. 10, 2013

(65) Prior Publication Data

US 2013/0193845 A1    Aug. 1, 2013

(30) Foreign Application Priority Data

Jan. 10, 2012 (JP) .................................. 2012-002257
Dec. 17, 2012 (JP) .................................. 2012-274845

(51) Int. Cl.
*H05B 33/10* (2006.01)
*H01L 33/48* (2010.01)
*H01L 33/54* (2010.01)
*H01L 33/62* (2010.01)

(52) U.S. Cl.
CPC .............. *H05B 33/10* (2013.01); *H01L 33/486* (2013.01); *H01L 33/54* (2013.01); *H01L 33/62* (2013.01); *H01L 2224/16145* (2013.01); *H01L 2224/48091* (2013.01); *H01L 2224/48247* (2013.01); *H01L 2224/73265* (2013.01)

(58) Field of Classification Search
CPC ....................................................... H05B 33/10
USPC ................................................... 313/512, 498
See application file for complete search history.

(56) References Cited

U.S. PATENT DOCUMENTS

| | | | |
|---|---|---|---|
| 8,585,272 B2* | 11/2013 | Kotani et al. | ................. 362/612 |
| 2008/0218072 A1* | 9/2008 | Haruna et al. | ................ 313/506 |
| 2009/0095969 A1* | 4/2009 | Kotani et al. | .................... 257/98 |
| 2009/0167142 A1* | 7/2009 | Kokubu et al. | ........... 313/318.11 |
| 2009/0315049 A1* | 12/2009 | Urasaki et al. | .................. 257/98 |
| 2009/0322197 A1* | 12/2009 | Helbing | .......................... 313/46 |
| 2009/0322205 A1* | 12/2009 | Lowery | ......................... 313/493 |
| 2011/0031527 A1* | 2/2011 | Kotani et al. | ................. 257/100 |
| 2011/0186340 A1* | 8/2011 | Kuramoto et al. | ............ 174/260 |
| 2011/0186886 A1* | 8/2011 | Watari et al. | .................... 257/98 |

FOREIGN PATENT DOCUMENTS

JP    2004-119743    4/2004

* cited by examiner

*Primary Examiner* — Elmito Breval
(74) *Attorney, Agent, or Firm* — Hamre, Schumann, Mueller & Larson, P.C.

(57) ABSTRACT

An LED module includes: an LED chip; and a resin case having a reflective surface surrounding the LED chip. An area contact inhibitor to inhibit area contact with an adjacent LED module is formed on an outer surface of the resin case.

17 Claims, 17 Drawing Sheets

LED MODULE

CROSS-REFERENCE TO RELATED APPLICATIONS

This application is based upon and claims the benefit of priority from Japanese Patent Application Nos. 2012-002257, filed on Jan. 10, 2012, and 2012-274845, filed on Dec. 17, 2012, the entire contents of which are incorporated herein by reference.

TECHNICAL FIELD

The present disclosure relates to an LED module including an LED chip as a light source.

BACKGROUND

FIG. 17 shows one example of a conventional LED module. An LED module 900 as shown in FIG. 17 includes an LED chip 902 mounted on a substrate 901. The LED chip 902 is surrounded by a frame-like reflector 905. A space surrounded by the reflector 905 is filled with a sealing resin 906. The LED chip 902 includes a sub-mount substrate 903 made of Si and a semiconductor layer 904 stacked on the sub-mount substrate 903. The semiconductor layer 904 makes electrical conduction with the substrate 901 via the sub-mount substrate 903. The LED module 900 has a substantially rectangular parallelepiped shape as a whole.

In some cases, a plurality of LED modules 900, each of which is configured above, may be used under a state where they are aligned by, for example, a parts feeder. The parts feeder is used to sequentially transport the plurality of LED modules 900 maintained in a container in a random manner, with them aligned in a row. Each LED module 900 has substantially a rectangular parallelepiped shape and a surface of the reflector 905 has a uniform planar shape. Accordingly, in the container of the parts feeder, the surface of the reflector 905 has a relatively large area and hence is likely to contact a surface of a reflector 905 of another LED module 900. The reflector 905 is made of, for example, a relatively soft resin having a relatively high adhesive property. Accordingly, when the reflector 905 is made of such a soft resin, surfaces of the reflectors 905 of the plurality of LED modules 900 in the parts feeder adhere to each other, which makes it difficult to transport the LED modules to the next process.

SUMMARY

The present disclosure provides various embodiments of an LED module which is capable of restraining surfaces of LED modules from being adhered to each other when a parts feeder is used.

According to some embodiments, an LED module is provided including: an LED chip; and a resin case having a reflective surface formed on an inner side of the resin case to surround the LED chip, wherein an area contact inhibitor to inhibit area contact with an adjacent LED module is formed on an outer surface of the resin case.

The resin case may be made of a resin material whose Shore hardness is 50 or less.

The resin case is made of a silicon resin or a resin containing a silicon resin as a main ingredient.

In some embodiments, the LED module further includes a mounting member having a mounting surface on which the LED chip is mounted.

In some embodiments, the resin case is configured to include a frame-like part which has the reflective surface formed on the inner side of the resin case and projects away from the mounting surface.

In some embodiments, the area contact inhibitor is formed on at least a portion of an outer surface of the frame-like part.

The area contact inhibitor formed on the outer surface of the frame-like part may be configured to include a first planar portion and a second planar portion which is different from the first planar portion and is located farther from the mounting member than the first planar portion.

A step may be formed between the first planar portion and the second planar portion, such that one end of the step close to the first planar portion is located farther from the LED chip than the other end close to the second planar portion.

Preferably, the first and second planar portions have different angles with respect to a normal direction of the mounting surface.

In some embodiments, at least one of the first and second planar portions is inclined to be closer to the LED chip in a direction perpendicular to the normal direction of the mounting surface as it becomes farther from the mounting surface in the normal direction.

In some embodiments, a first angle between the first planar portion and the mounting surface is smaller than a second angle between the second planar portion and the mounting surface.

The area contact inhibitor formed on the outer surface of the frame-like part may have a curved shape.

In some embodiments, the area contact inhibitor formed on the outer surface of the frame-like part has at least one band-like ridge.

The band-like ridge may extend away from the mounting surface.

In some embodiments, the resin case has a square shape when viewed from the normal direction of the mounting surface and the area contact inhibitor is formed on all outer surfaces of the resin case.

The area contact inhibitor may be configured to include a concave-convex shape.

In some embodiments, the mounting member may be constituted by a metal lead having the mounting surface.

In some embodiments, the resin case may be configured to include a base part which is adjacent to an opposite side to the mounting surface with respect to the lead and is integrated with the frame-like part.

These and other features of the present disclosure will be more apparent from the following description with reference to the accompanying drawings.

DETAILED DESCRIPTION

Figure 1:
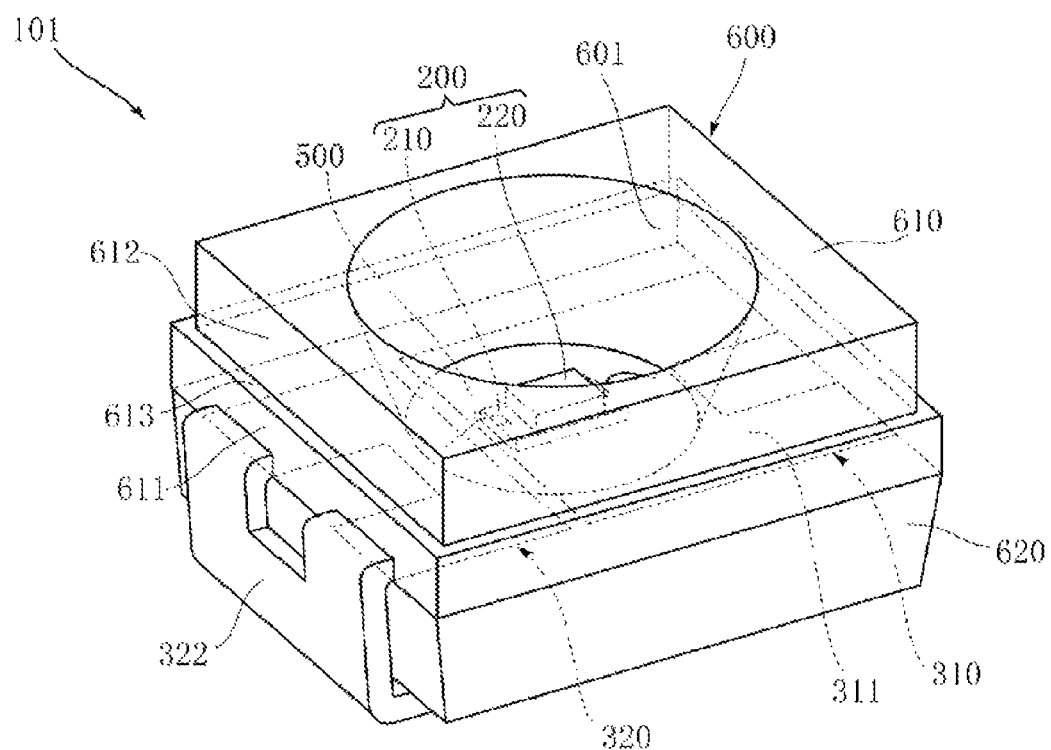
FIG. 1 is a perspective view showing an LED module according to a first embodiment of the present disclosure.
Figure 2:
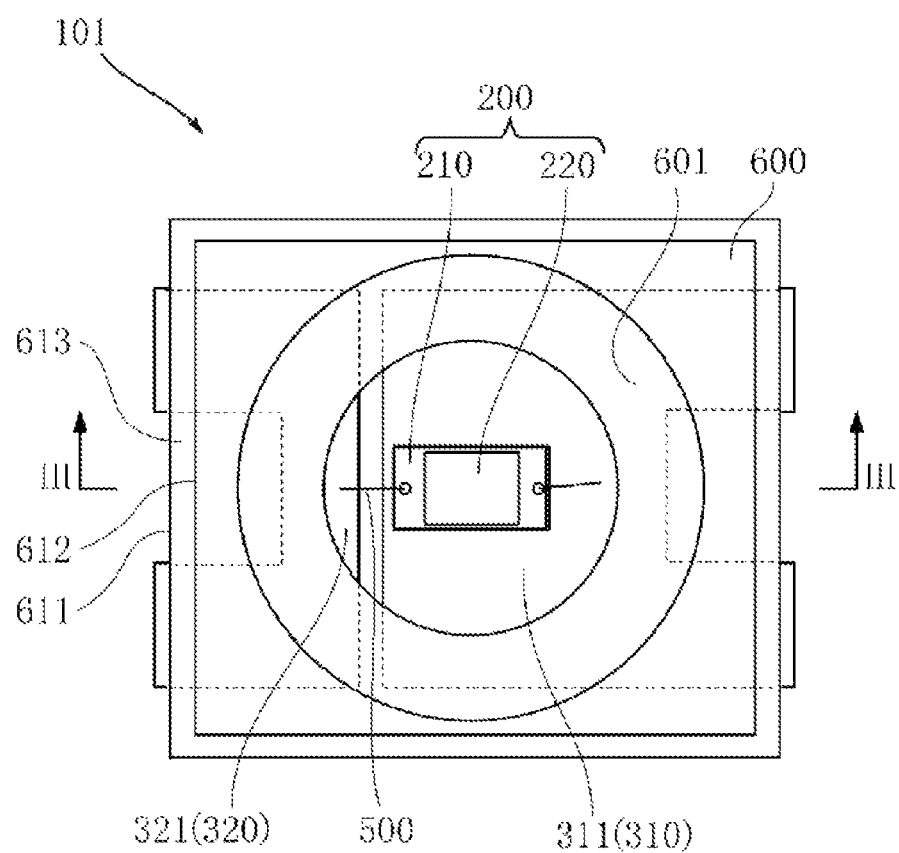
FIG. 2 is a plan view showing the LED module of FIG. 1.

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Various embodiments of the present disclosure will be now described in detail with reference to the drawings.

FIGS. 1 to 4 show an LED module 101 based on a first embodiment of the present disclosure. The LED module 101 includes metallic leads 310 and 320, an LED chip 200, two wires 500, a resin case 600 and a sealing resin 700. For the purpose of easy understanding, the sealing resin 700 is not shown in FIGS. 1 and 2.

Figure 3:
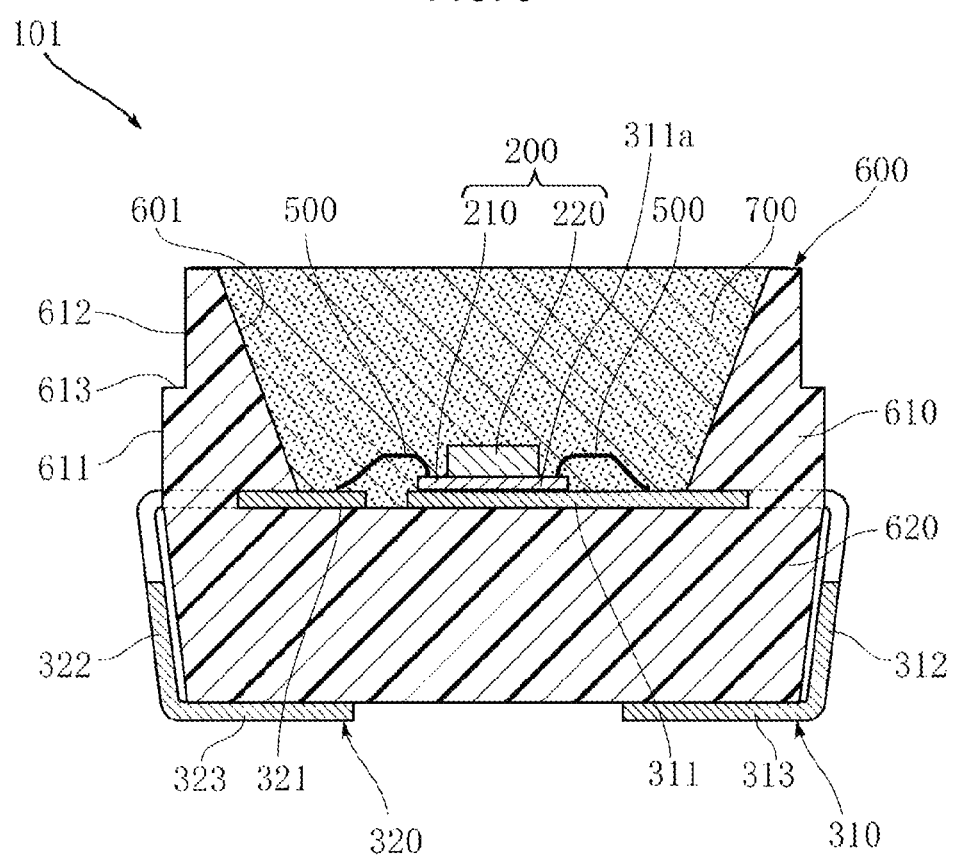
FIG. 3 is a sectional view taken along line III-III in FIG. 2.

The leads 310 and 320 are formed by carrying out a punching process and a bending process for a plate made of, for example, Cu or Cu alloy. The lead 310 includes a bonding part 311, a bypass part 312 and a mounting terminal 313. The LED chip is bonded to the bonding part 311. The top surface of the bonding part 311 corresponds to a mounting surface 311a on which the LED chip 200 is mounted. The lead 310 may correspond to a mounting member. The lead 320 includes a bonding part 321, a bypass part 322 and a mounting terminal 323. The bonding part 311 and the mounting terminal 313 are substantially in parallel and are interconnected by the bypass part 312. The bonding part 321 and the mounting terminal 323 are substantially in parallel and are interconnected by the bypass part 312. The mounting terminals 313 and 323 are used to mount the LED module 101 on, for example, a circuit board (not shown). The LED module 101 as configured above forms a so-called top-view type LED module which emits light in an upward direction as shown in FIG. 3 when it is mounted on the circuit board that may be located under the LED module 101 as shown in FIG. 3.

Figure 4:
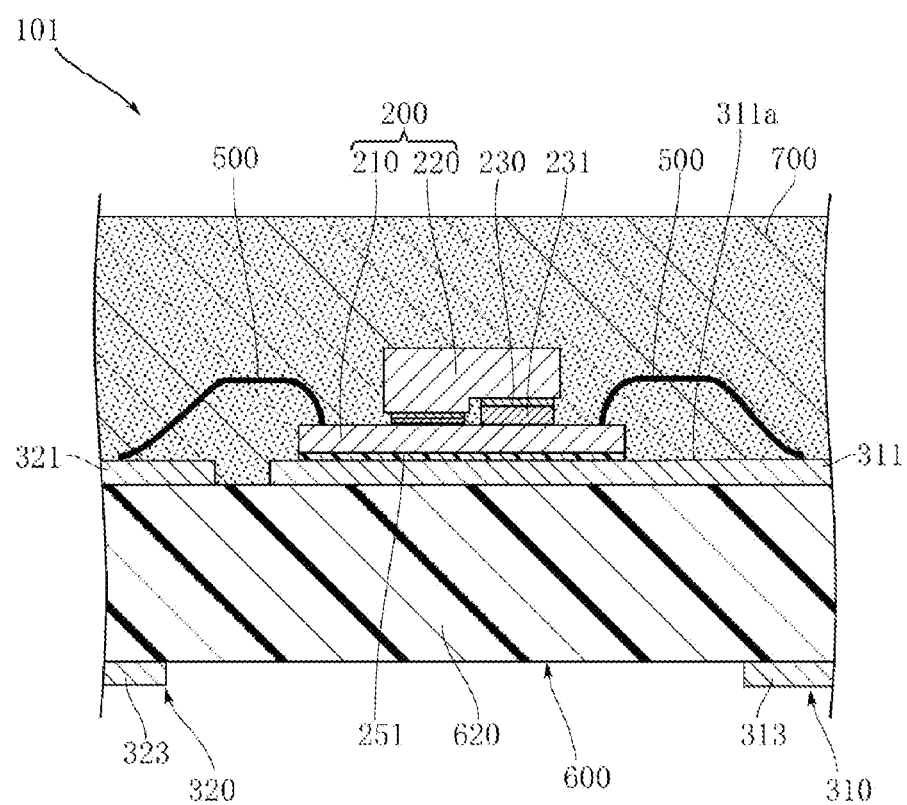
FIG. 4 is an enlarged sectional view showing main parts of the LED module of FIG. 1.
Figure 5:
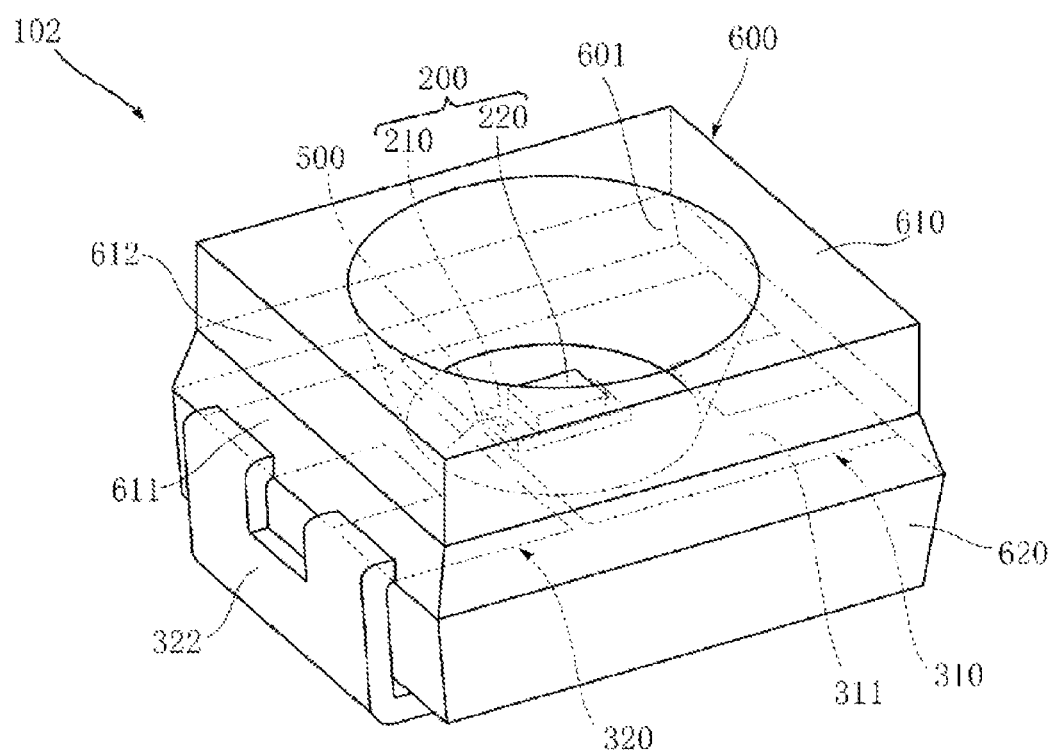
FIG. 5 is a perspective view showing an LED module according to a second embodiment of the present disclosure.
Figure 6:
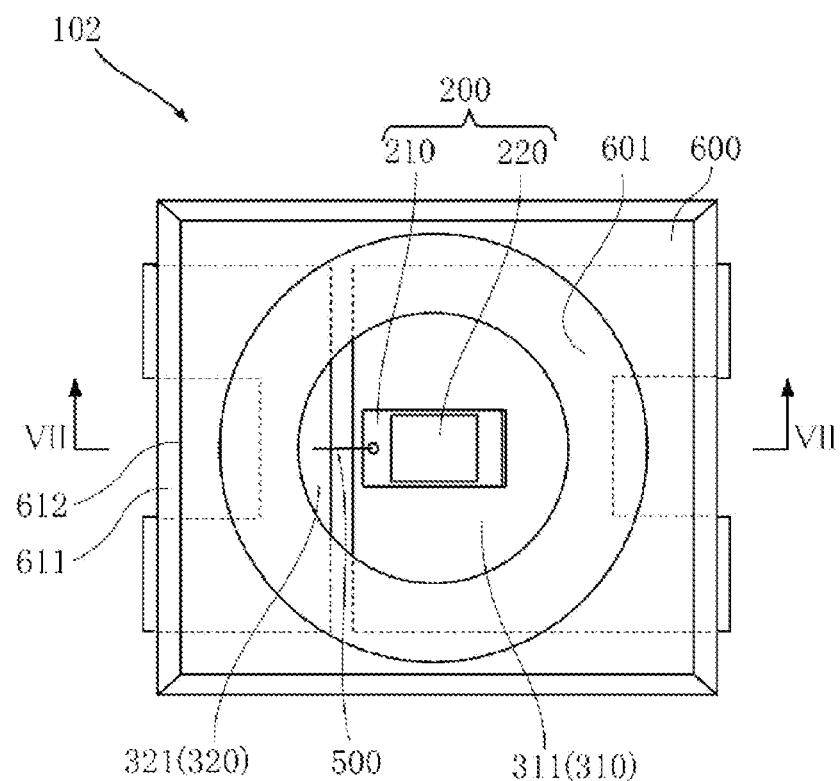
FIG. 6 is a plan view showing the LED module of FIG. 5.

The LED chip 200 has a structure having a sub-mount substrate 210 made of Si and a semiconductor layer 220 including an n type semiconductor layer made of, for example, GaN, an active layer and a p type semiconductor layer stacked in this order, and emits blue light, for example. As shown in FIG. 4, two electrode pads 230 are formed in the semiconductor layer 220 at a side of the sub-mount substrate 210. These electrode pads 230 are bonded to a wiring pattern (not shown) formed on the sub-mount substrate 210 by means of an insulating paste 231. The sub-mount substrate 210 is bonded to the bonding part 311 by means of an insulating paste 251. Two electrodes (not shown) are formed on the sub-mount substrate 210. One end of two wires 500 are bonded to these electrodes, respectively, which forms a so-called two-wire type LED chip 200. The other end of one of the wires 500 is bonded to the bonding part 311 and the other end of the other of the wires 500 is bonded to the bonding part 321.

The resin case 600 is made of, for example, a white resin and includes a frame-like part 610 and a base part 620. The frame-like part 610 projects from the base part 620 in a normal direction of the mounting surface 311a of the lead 310. A reflective surface 601 is formed on an inner side of the frame-like part 610. The reflective surface 601 surrounds the LED chip 200. In this embodiment, the reflective surface 601 has a partial-conical shape and is inclined to become farther from the LED chip 200 in a direction perpendicular to the normal direction of the mounting surface 311a as it becomes farther from the mounting surface 311a in the normal direction. The frame-like part 610 having the reflective surface 601 plays a role as a reflector.

An outer side of the frame-like part 610 has substantially a spherical shape when viewed from a top view of the LED module 101. The outer side of the frame-like part 610 includes planar portions 611 and 612. The planar portion 611 corresponds to a first planar portion and the planar portion 612 corresponds to a second planar portion. The planar portion 611 is located close to the leads 310 and 320 and the planar portion 612 is located farther from the leads 310 and 320 than the planar portion 611. In this embodiment, the planar portions 611 and 612 follow the normal direction of the mounting surface 311a and a step 613 is formed between the planar portion 611 and the planar portion 612. The planar portion 611 and the planar portion 612 are connected through the step 613. The step 613 is formed such that one end close to the planar portion 611 is located farther from the LED chip 200 than the other end close to the planar portion 612 in a direction perpendicular to the normal direction of the mounting surface 311a. Accordingly, the planar portion 611 is located farther from the LED chip 200 than the planar portion 612. As described above, the configuration including the planar portions 611 and 612 and the step 613 at the outer side of the frame-like part 610 corresponds to one example of an area contact inhibitor. In this embodiment, the planar portions 611 and 612 as the area surface inhibitors are formed in all of the outer sides of the resin case 600.

The base part 620 is connected to a lower portion of the frame-like part 610 and is formed in such a manner that it is embraced by the leads 310 and 320. The resin case 600 is made of a relatively soft resin material whose Shore D hardness (hardness measured using a type D durometer) is 50 or less, for example. The resin case 600 is made of, for example, a silicon resin or a mixture of silicon resin and epoxy resin (in the mixture, the silicon resin is contained as a main ingredient and its content is, for example, 90% or more).

The sealing resin 700 covers the LED chip 200 and fills a space surrounded by the reflective surface 601. The sealing resin 700 is made of a mixture of, for example, transparent epoxy resin and fluorescent material. The fluorescent material emits yellow light, for example, when it is excited by blue light emitted from the semiconductor layer 220 of the LED chip 200. The LED module 101 emits white light by mixing the blue light and the yellow light. Another example of the fluorescent material may include a material emitting red light or green light when it excited by the blue light.

A method of manufacturing the LED module 101 will be now described by way of one example. First, the semiconductor layer 220 is bonded to the sub-mount substrate 210.

Subsequently, the resin case 600 is formed in the leads 310 and 320. Portions of the leads 310 and 320 (or portions of the bonding parts 311 and 321) are buried in the resin case 600 and such lead 310 and resin case 600 may be obtained by an insert molding method using a mold. Subsequently, the LED chip 200 is mounted on the mounting surface 311a of the lead 310 (or the bonding part 311). Subsequently, the wires 500 are bonded to the LED chip 200. Then, the LED module 101 is completed by forming the sealing resin 700.

An operation of the LED module 101 will be described below.

In the LED module 101 of this embodiment, the outer side of the frame-like part 610 of the resin case 600 has a configuration including the planar portions 611 and 612 and the step 613, i.e., has a shape different from a uniform planar shape. The outer side of the frame-like part 610 occupies much of the exposed surface of the resin case 600. This configuration of the outer side of the frame-like part 610 restrains the outer side of the frame-like part 610 from making area contact with a surface of an adjacent LED module 101, for example if a parts feeder is used for the LED module 101. In other words, the configuration of the outer side of the frame-like part 610 may reduce a contact area of the frame-like part 610 that makes contact with the surface of the adjacent LED module 101. Accordingly, with the LED module 101 of this embodiment, it is possible to restrain surfaces of a plurality of LED modules 101 from being adhered to each other when a parts feeder is used.

The resin case 600 is made of the relatively soft resin whose Shore D hardness is 50 or less, as described above, and accordingly, surfaces of resin cases 600 can be easily adhered to each other as compared to when the resin case 600 is made of a hard resin material. Since the planar portions 611 and 612 and the step 613 that act as area contact inhibitors are formed in the outer side of the frame-like part 610 occupying much of the surface of the resin case 600, it is possible to restrain the LED modules 101 from being adhered to each other.

In the LED module 101, since the resin case 600 may be sometimes heated at a high temperature by heat emitted from the LED chip 200, the resin case 600 is made of a silicon resin or a resin material which mainly consists of a silicon resin. Since a silicon resin has a thermosetting property and a high heat-resistance, the resin case 600 made of such a material is suitable to increase durability of the LED module 101. In addition, portions of the metal leads 310 and 320 buried in the resin case 600 have a relatively high thermal conductivity. Accordingly, the heat emitted from the LED chip 200 can be more efficiently dissipated out of the LED module 101. This is beneficial for improvement of the durability of the LED module 101.

The planar portions 611 and 612 and the step 613 formed in the outer side of the frame-like part 610 of the resin case 600 are displaced to become closer to the LED chip 200 in a direction perpendicular to the normal direction of the mounting surface 311a as they become farther from the mounting surface 311a in the normal direction as a whole. With this configuration, in forming the resin case 600 using a mold, a portion corresponding to the frame-like part 610 can be easily drawn out of the mold that is divided into two parts in the vertical direction.

FIGS. 5 to 15 show other embodiments of the present disclosure. In these figures, the same or similar elements as the first embodiment are denoted by the same reference numerals as the first embodiment.

FIGS. 5 to 8 show an LED module 102 according to a second embodiment. The LED module 102 of this embodiment has the same configuration as the above-described LED module 101 except for a configuration of the LED chip 200 and a configuration of the frame-like part 610 in the resin case 600.

Figure 8:
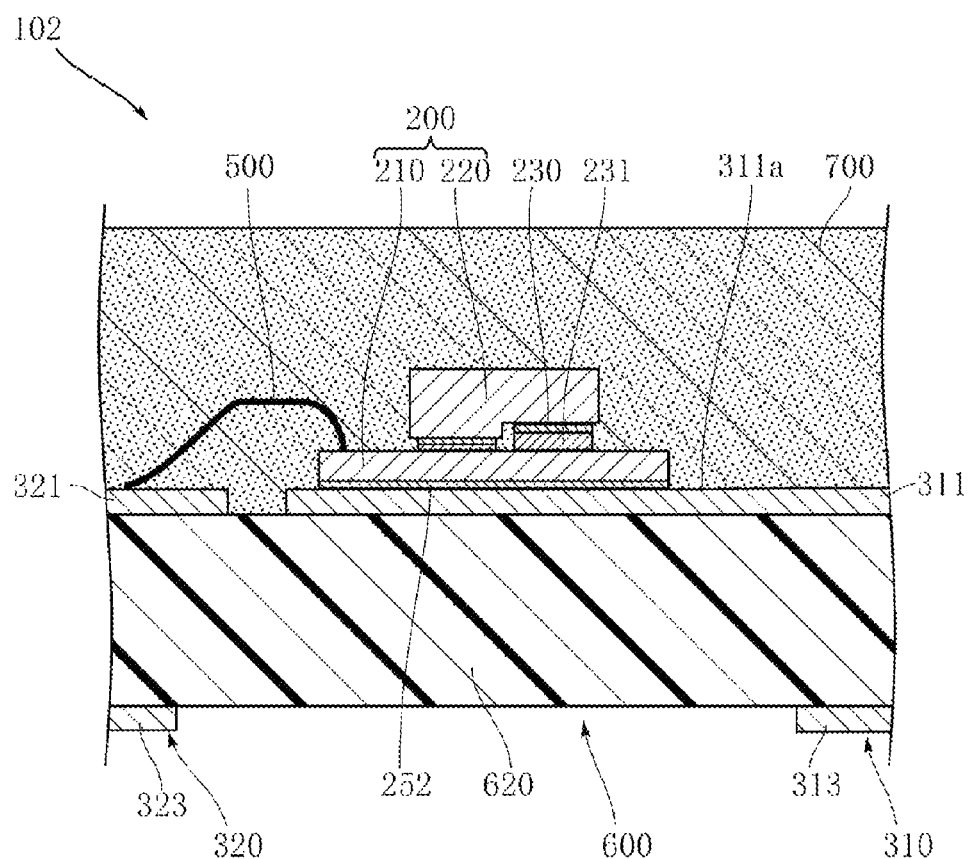
FIG. 8 is an enlarged sectional view showing main parts of the LED module of FIG. 5.

In the second embodiment, as shown in FIG. 8, only one wire 500 is bonded to the sub-mount substrate 210 of the LED chip 200, i.e., the LED chip 200 is configured as a so-called one-wire type. The wire 500 is connected to the bonding part 321. An electrode (not shown) is formed in the bottom of the sub-mount substrate 210. This electrode is conductively bonded to the bonding part 311 by a conductive paste 252 while making electrical conduction with one electrode pad 230 via an electrical conduction path (not shown) formed on the sub-mount substrate 210.

Figure 7:
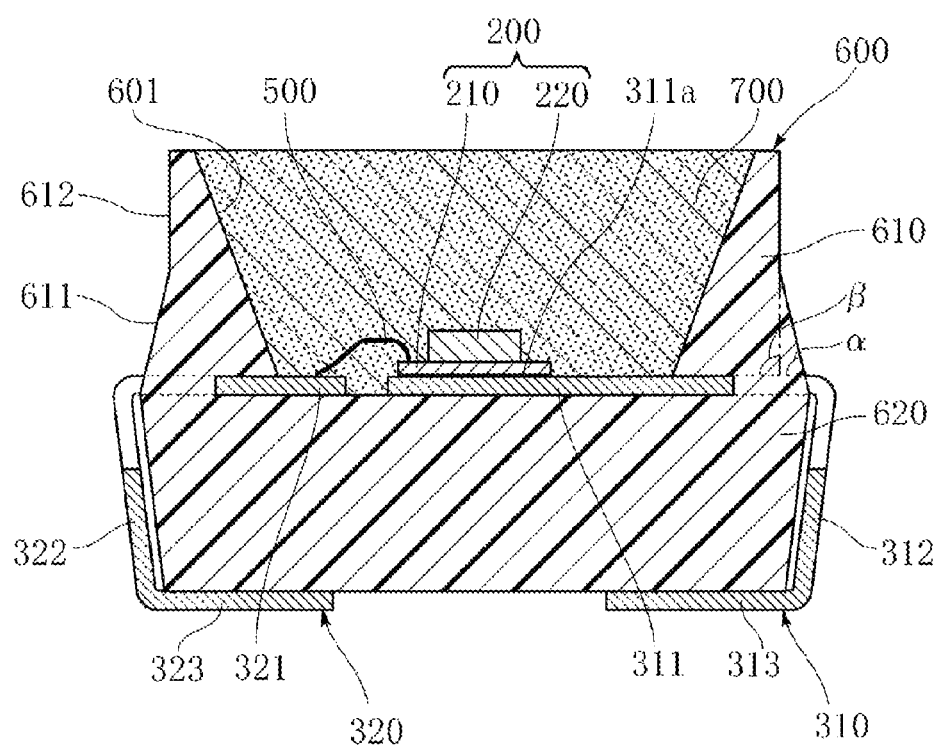
FIG. 7 is a sectional view taken along line VII-VII in FIG. 6.

As shown in FIG. 7, the outer side of the frame-like part 610 of the resin case 600 includes the planar portions 611 and 612 but has no step formed between the planar portion 611 and the planar portion 612, unlike the first embodiment. In the second embodiment, the planar portion 611 and the planar portion 612 are connected to each other at a bent portion. The planar portion 611 is inclined to be closer to the LED chip 200 in a direction perpendicular to the normal direction of the mounting surface 311a as it becomes farther from the mounting surface 311a in the normal direction. The planar portion 612 extends in the normal direction of the mounting surface 311a. An angle α between the planar portion 611 and the mounting surface 311a is set to be smaller than an angle β between the planar portion 612 and the mounting surface 311a.

In the LED module 102 of this embodiment, the outer side of the frame-like part 610 of the resin case 600 has a configuration including the planar portions 611 and 612, i.e., has a shape different from a uniform planar shape. This restrains the outer side (the planar portions 611 and 612) of the frame-like part 610 from making area contact with a surface of an adjacent LED module 102, for example if a parts feeder is used for the LED module 102. In addition, the angle α between the planar portion 611 and the mounting surface 311a is smaller than the angle β between the planar portion 612 and the mounting surface 311a. Accordingly, the outer side of the frame-like part 610 is recessed laterally toward the center of the LED module 102, which makes it difficult to make area contact with the surface of the adjacent LED module 102.

The planar portions 611 and 612 formed in the outer side of the frame-like part 610 are displaced to become closer to the LED chip 200 in a direction perpendicular to the normal direction of the mounting surface 311a as they become farther from the mounting surface 311a in the normal direction as a whole. With this configuration, in forming the resin case 600 using a mold, a portion corresponding to the frame-like part 610 can be easily drawn out of the mold that is divided into two parts in the vertical direction.

As a modification of this embodiment, the planar portion 611 may extend in the normal direction of the mounting surface 311a and the planar portion 612 may be inclined to be closer to the LED chip 200 in a direction perpendicular to the normal direction of the mounting surface 311a as it becomes farther from the mounting surface 311a in the normal direction. Alternatively, both of the planar portions 611 and 612 may be inclined with respect to the normal direction of the mounting surface 311a.

Figure 9:
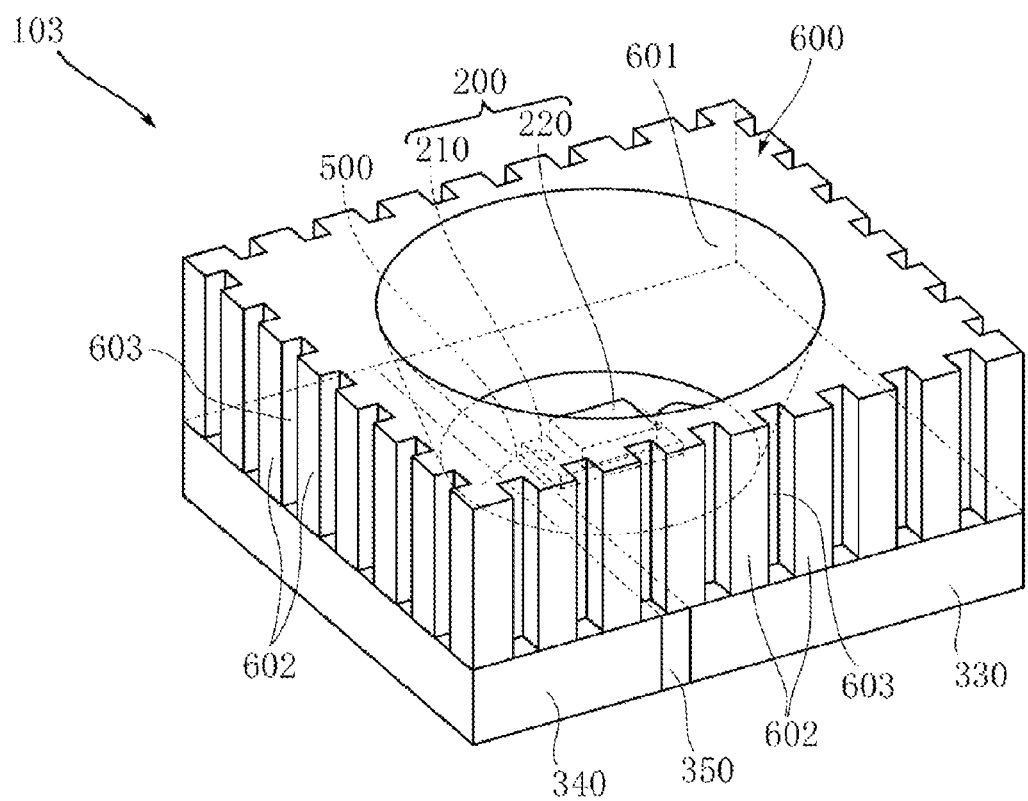
FIG. 9 is a perspective view showing an LED module according to a third embodiment of the present disclosure.
Figure 10:
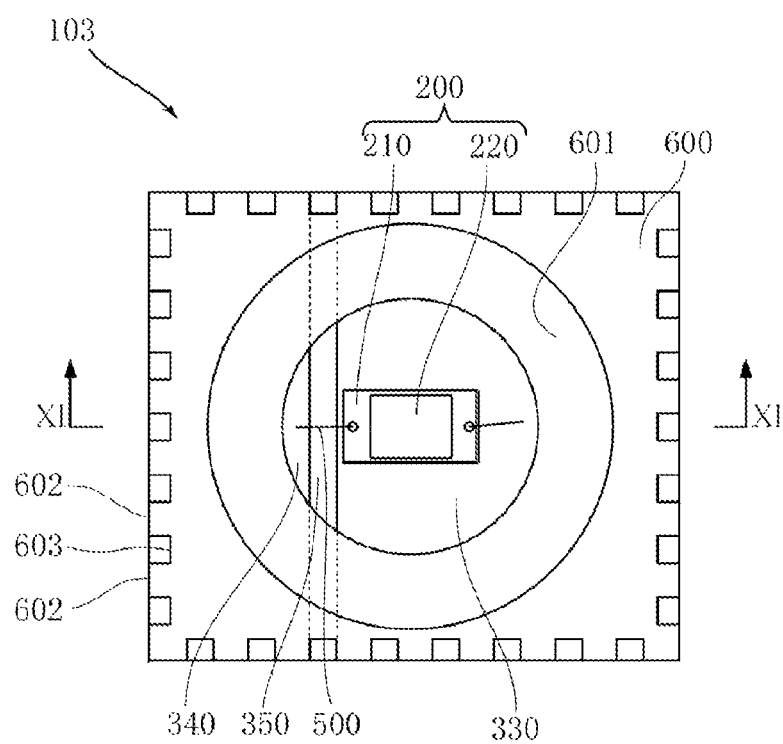
FIG. 10 is a plan view showing the LED module of FIG. 9.
Figure 11:
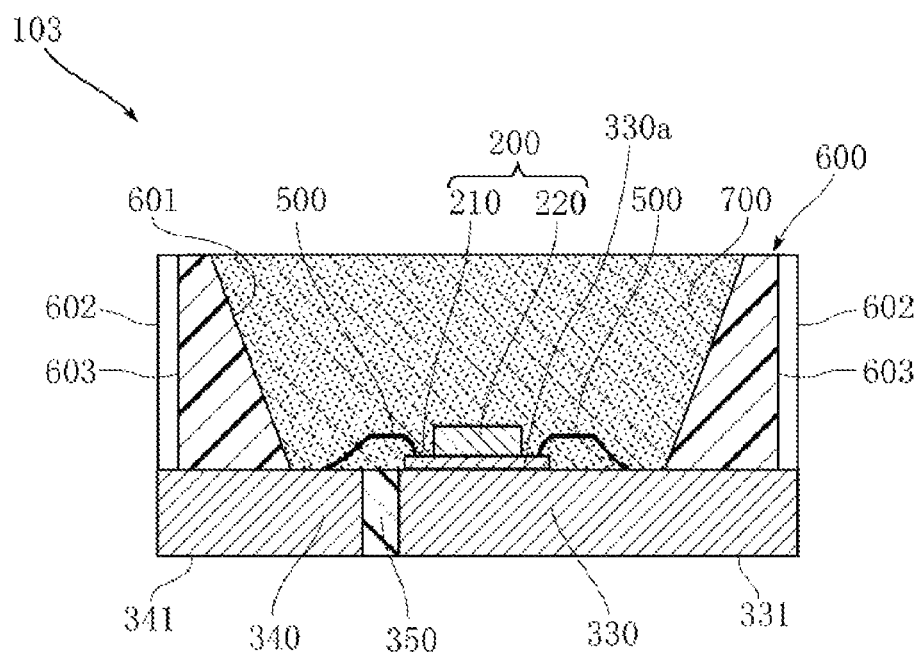
FIG. 11 is a sectional view taken along line XI-XI in FIG. 10.
Figure 12:
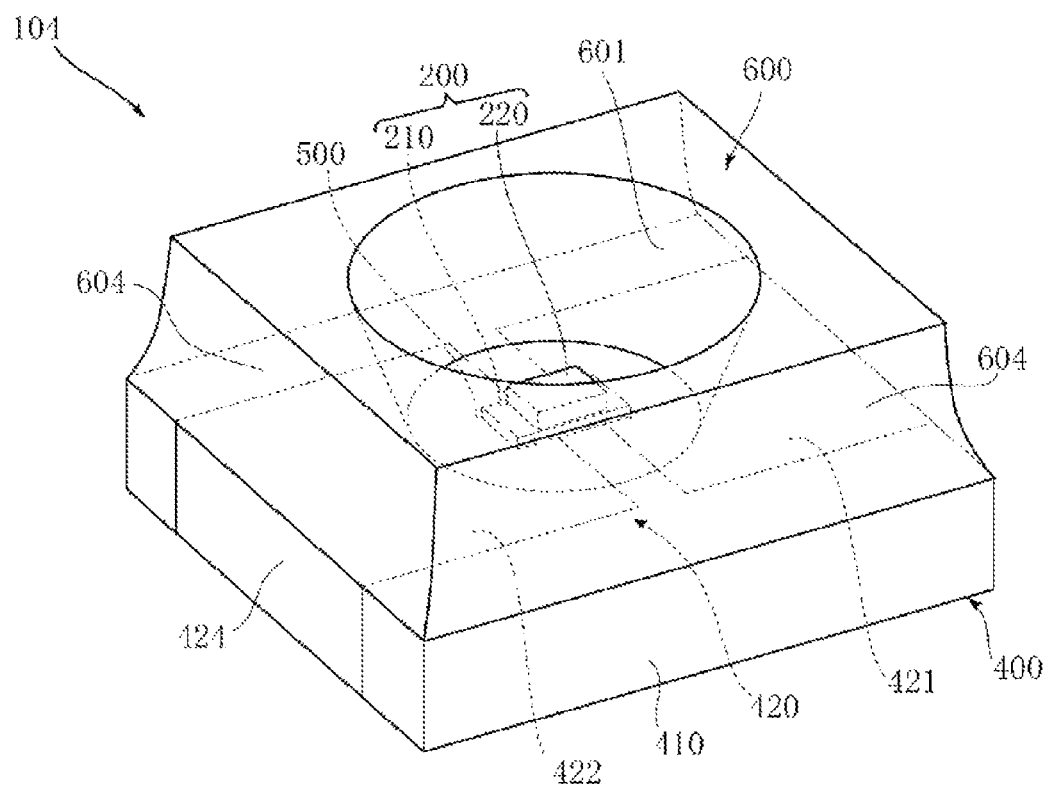
FIG. 12 is a perspective view showing an LED module according to a fourth embodiment of the present disclosure.
Figure 13:
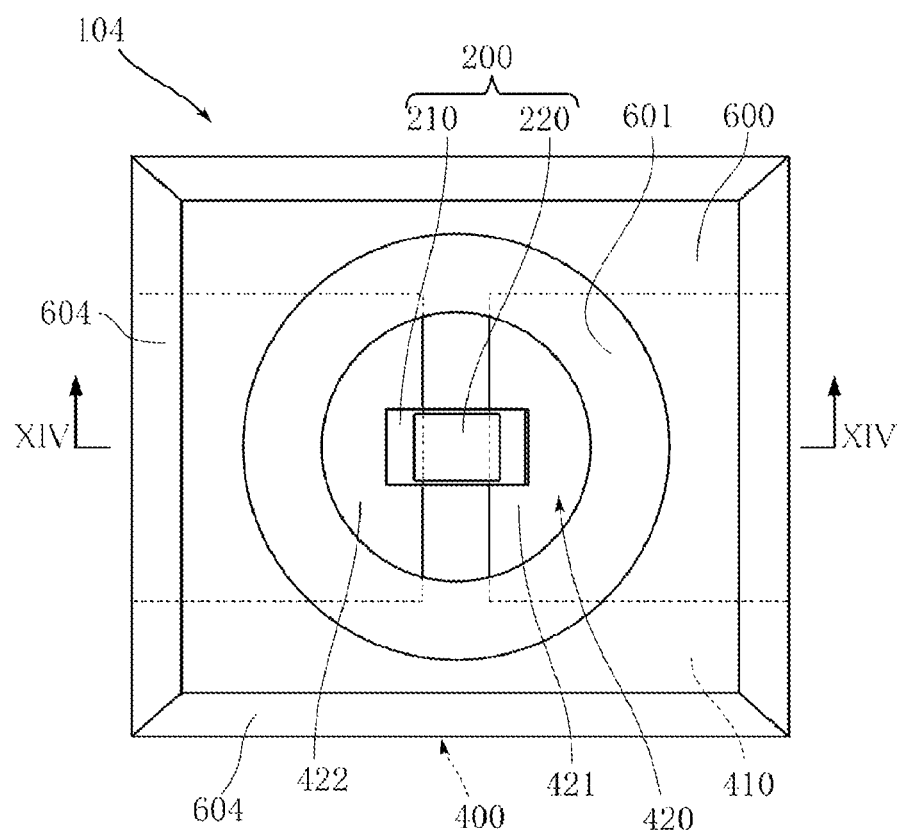
FIG. 13 is a plan view showing the LED module of FIG. 12.
Figure 14:
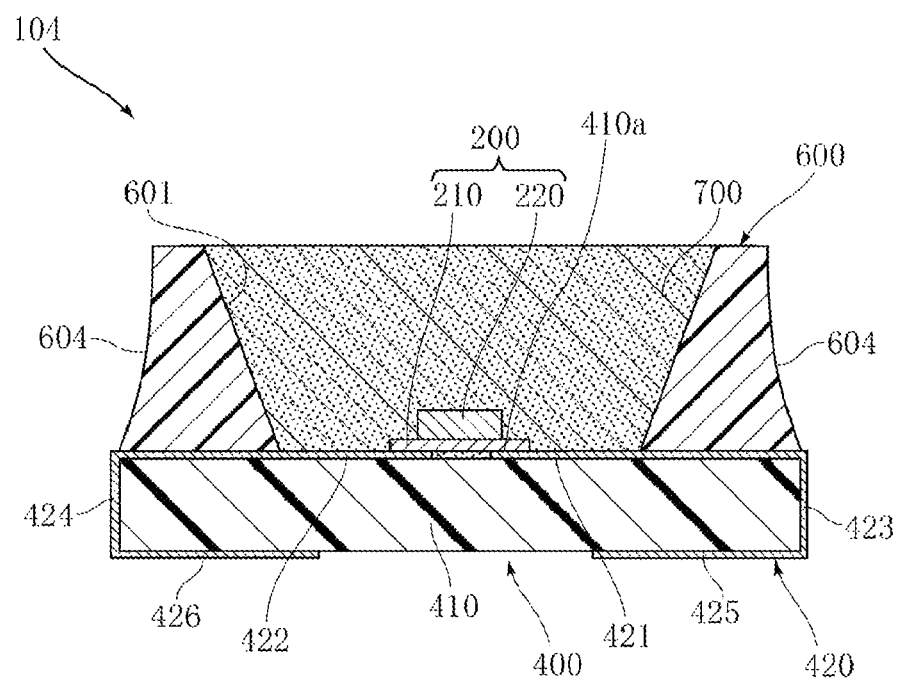
FIG. 14 is a sectional view taken along line XIV-XIV in FIG. 13.

FIGS. 9 to 11 show an LED module 103 according to a third embodiment of the present disclosure. The LED module 103 of the third embodiment has the same configuration as the above-described LED module 101 except for the inclusion of leads 330 and 340 and the configuration of the resin case 600.

The leads 330 and 340 are formed by performing a punching process for a plate made of metal such as, for example, Cu, an alloy of Cu or the like. A resin 350 is filled between the leads 330 and 340. The LED chip 200 is mounted on a top surface (a mounting surface 330a) of the lead 330. The lead 330 corresponds to a mounting member recited in the present disclosure. Surfaces of the leads 330 and 340 in an opposite side to the top surface on which the LED chip 200 is mounted serve as mounting terminals 331 and 341. The mounting terminals 331 and 341 are used to mount the LED module 103 on, for example, a circuit board (not shown). The LED chip 200 of this embodiment is configured as the two-wire type shown in FIG. 4. One of the two wires 500 is bonded to the top of the lead 330 and the other is bonded to the top of the lead 340.

The resin case 600 is constituted by only a portion corresponding to the frame-like part 610, unlike the first and second embodiments. A plurality of band-like ridges 602 is formed on an outer side of the resin case 600. The band-like ridges 602 extend in the normal direction of the mounting surface 330a and have a square section. In the third embodiment, the band-like ridges 602 are adjacent to each other. In addition, grooves 603 having a square section are formed between the adjacent band-like ridges 602, respectively. These grooves 603 extend in the normal direction of the mounting surface 330a.

In the LED module 103 of the third embodiment, an outer side of the frame-like part 610 of the resin case 600 has a concave-convex shape having a plurality of band-like ridges 602 and grooves 603, instead of a uniform planar shape. This restrains the outer side of the resin case 600 from making area contact with a surface of an adjacent LED module 103 if a parts feeder is used for the LED module 103. In addition, since the band-like ridges 602 extend away from the mounting surface 330a, in forming the resin case 600 using a mold, the resin case 600 can be easily drawn out of the mold that is divided into two parts in the vertical direction.

FIGS. 12 to 15 show an LED module 104 according to a fourth embodiment of the present disclosure. The LED module 104 of the fourth embodiment has the same configuration as the above-described LED module 101 except for the inclusion of a substrate 400 and the configuration of the resin case 600.

The substrate 400 includes a base material 410 and a wiring pattern 420 formed on the base material 410. The base material 410 has a square shape and is made of, for example, glass epoxy resin. The wiring pattern 420 is made of metal such as, for example, Cu, Ag or the like and includes bonding portions 421 and 422, bypass portions 423 and 424 and mounting terminals 425 and 426. The bonding portions 421 and 422 are formed on a top surface (a mounting surface 410a) of the base material 410. The wiring pattern 420 corresponds to a mounting member recited in the present disclosure. The bypass portions 423 and 424 are connected to the bonding portions 421 and 422 and are formed in both sides of the base material 410. The mounting terminals 425 and 426 are formed on a bottom of the base material 410 and are connected to the bypass portions 423 and 424. The mounting terminals 425 and 426 are used to mount the LED module 104 on, for example, a circuit board (not shown).

Figure 15:
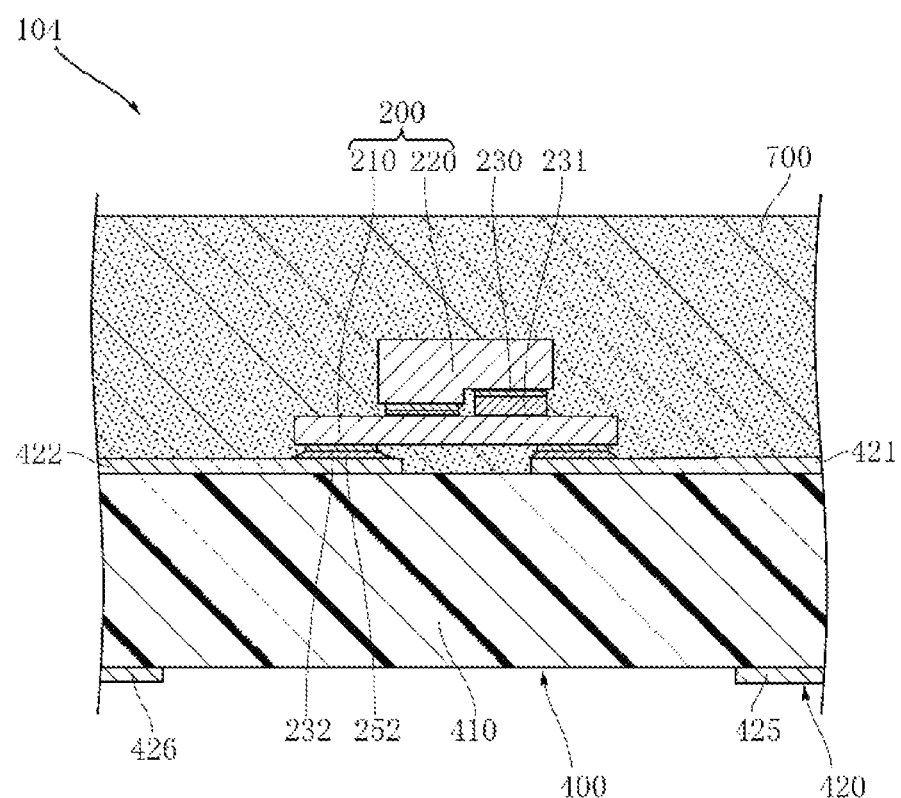
FIG. 15 is an enlarged sectional view showing main parts of the LED module of FIG. 12.

In this embodiment, as shown in FIG. 15, two electrode pads 232 are formed on a bottom of the sub-mount substrate 210 of the LED chip 200. These electrode pads 232 allows for electrical conduction with the two electrode pads 230 via an electrical conduction path (not shown) formed in the sub-mount substrate 210. The two electrode pads 232 are conductively connected to the bonding portions 421 and 422 via the conductive paste 252. The LED chip 200 as configured above is called a "flip-chip type."

The resin case 600 is constituted by only a portion corresponding to the frame-like part 610, unlike the first to fourth embodiments. An outer side 604 of the resin case 600 has a vertical concave-curved shape. The outer side 604 is displaced to become closer to the LED chip 200 in a direction perpendicular to the normal direction of the mounting surface 410a as it becomes farther from the mounting surface 410a in the normal direction.

In the LED module 104 of the fourth embodiment, the outer side 604 of the frame-like part 610 of the resin case 600 has a curved shape, instead of a uniform planar shape. This restrains the outer side 604 of the resin case 600 from making area contact with a surface of an adjacent LED module 104 if a parts feeder is used for the LED module 104. In addition, the outer side 604 is displaced to become closer to the LED chip 200 in a direction perpendicular to the normal direction of the mounting surface 410a as it becomes farther from the mounting surface 410a in the normal direction. With this configuration, in forming the resin case 600 using a mold, the resin case 600 can be easily drawn out of the mold that is divided into two parts in the vertical direction.

Figure 16:
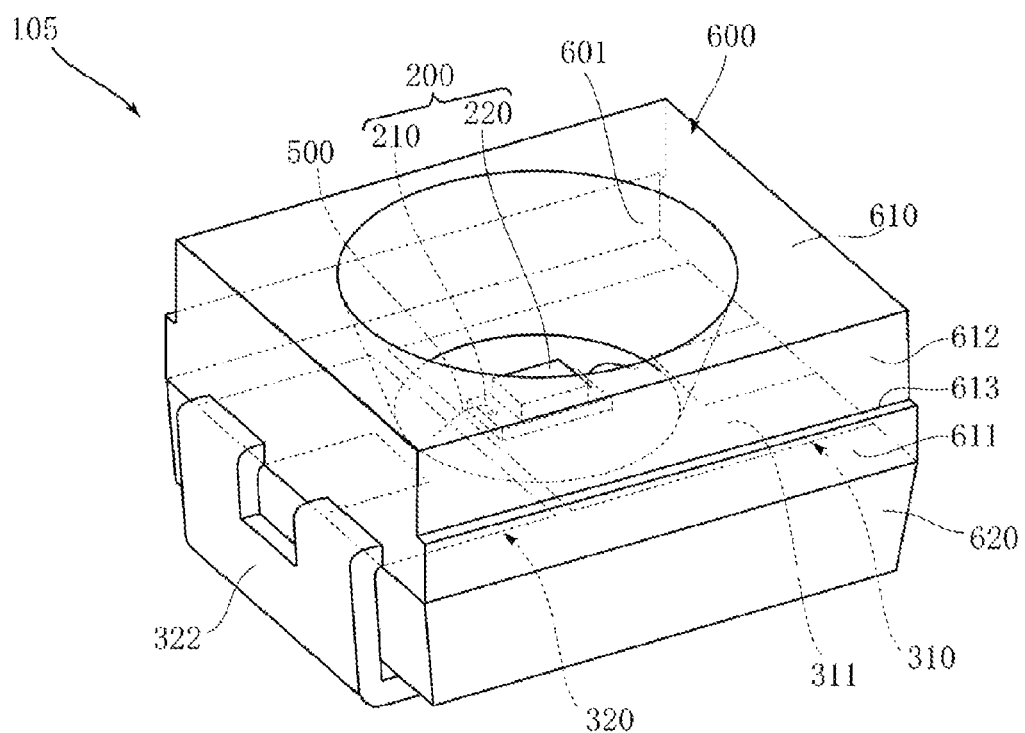
FIG. 16 is a perspective view showing an LED module according to a fifth embodiment of the present disclosure.
Figure 17:
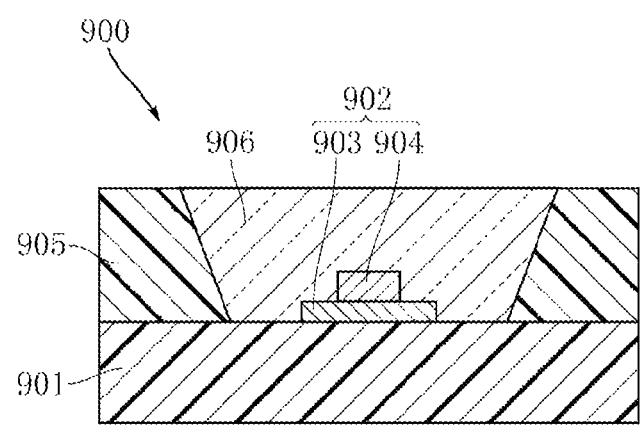
FIG. 17 is a sectional view showing one example of a conventional LED module.

FIG. 16 shows an LED module 105 according to a fifth embodiment of the present disclosure. The LED module 105 of the fifth embodiment has the same configuration as the above-described LED module 101 except for regions where the planar portions 611 and 612 are formed.

In this embodiment, the planar portions 611 and 612 are formed in two opposite regions of the outer side of the frame-like part 610 of the resin case 600. The regions where the planar portions 611 and 612 are formed are regions where the leads 310 and 320 do not project. On the other hand, regions of the outer side of the frame-like part 610 where the leads 310 and 320 project are flat regions having no planar portion 611 and 612 (i.e., having no step). With this configuration, in forming the resin case using a mold, it is possible to relatively simplify a shape of the regions where the leads 310 and 320 project. This provides an advantage of higher manufacturability of the mold and higher reliable formation of the resin case 600. In this manner, the area contact inhibitor recited in the present disclosure may be formed on at least a surface other than the surface from which the leads 310 and 320 project. This is because the surface from which the leads project is less likely to make an area contact. In addition, the area contact inhibitor can achieve its desired effect even when it is formed on a single surface.

The LED modules of the present disclosure are not limited to the above-described embodiments and details of components of which may be designed in other different ways.

Although it has been illustrated in the third embodiment that the area contact inhibitor has the plurality of band-like ridges as one example of the concave-convex shape, the concave-convex shape is not limited thereto. For example, the concave-convex shape may have one or more projections or concave portions formed on the surface of the resin case or a sprinkled surface continuously formed on the surface of the resin case. Such a concave-convex shape may be formed, for example by rendering a mold for formation of the resin case into a corresponding shape. In addition, if a sprinkled surface is formed on the surface of the resin case, the concave-convex shape may be formed by performing a blast process on the surface of the resin case having a smooth planar shape. However, a concave-convex shape formed by a mold is more preferable to a concave-convex shape formed by a blast process since the latter is small and provides less effect of inhabitation of area contact. In addition, if a plurality of concave-convex portions is formed on one side of a square resin case, it is preferable to arrange these concave-convex portions over the side uniformly or at equal intervals.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED module comprising:
   an LED chip;
   a resin case having a reflective surface formed on an inner side of the resin case to surround the LED chip, a flat outer surface, and an uneven outer surface;
   a mounting member having a mounting surface on which the LED chip is mounted, and including a bypass part projecting from the flat outer surface of the resin case; and
   a concave-convex area contact inhibitor arranged to reduce a contact area contacting an adjacent LED module, including planar portions, and formed on the uneven outer surface of the resin case,
   wherein the resin case is made of a resin material including at least one of a silicon resin or a resin containing a silicon resin as a main ingredient, and
   wherein the resin material has a Shore hardness of 50 or less.

2. The LED module of claim 1, wherein the resin case is configured to include a frame-like part which has the reflective surface formed on the inner side of the resin case and projects away from the mounting surface, and the flat and uneven outer surfaces.

3. The LED module of claim 2, wherein the planar portions of the concave-convex area contact inhibitor is formed on at least a portion of the uneven outer surface of the frame-like part.

4. The LED module of claim 3, wherein the planar portions of the concave-convex area contact inhibitor formed on the uneven outer surface of the frame-like part include a first planar portion and a second planar portion which is different from the first planar portion and is located farther from the mounting member than the first planar portion.

5. The LED module of claim 4, wherein a step is formed between the first planar portion and the second planar portion, such that one end of the step close to the first planar portion is located farther from the LED chip than the other end close to the second planar portion.

6. The LED module of claim 4, wherein the first and second planar portions have different angles with respect to a normal direction of the mounting surface.

7. The LED module of claim 6, wherein at least one of the first and second planar portions is inclined to be closer to the LED chip in a direction perpendicular to the normal direction of the mounting surface as it becomes farther from the mounting surface in the normal direction.

8. The LED module of claim 7, wherein a first angle between the first planar portion and the mounting surface is smaller than a second angle between the second planar portion and the mounting surface.

9. The LED module of claim 3, wherein the resin case has a square shape when viewed from a normal direction of the mounting surface.

10. The LED module of claim 1, wherein the concave-convex area contact inhibitor is configured to include a concave-convex shape.

11. The LED module of claim 2, wherein the mounting member is constituted by a metal lead having the mounting surface.

12. The LED module of claim 11, wherein the resin case is configured to include a base part which is adjacent to an opposite side to the mounting surface with respect to the lead and is integrated with the frame-like part.

13. An LED module comprising:
    an LED chip;
    a resin case having a frame-like part including a reflective surface formed on an inner side of the resin case to surround the LED chip;
    a mounting member having a mounting surface on which the LED chip is mounted, the frame-like part projecting away from the mounting member;
    a concave-convex area contact inhibitor arranged to reduce a contact area contacting an adjacent LED module, having a curved shape, and formed on at least a portion of an outer surface of the frame-like part,
    wherein the resin case is made of a resin material including at least one of a silicon resin or a resin containing a silicon resin as a main ingredient, and
    wherein the resin material has a Shore hardness of 50 or less.

14. The LED module of claim 13, wherein the area contact inhibitor is formed on all outer surfaces of the resin case.

15. An LED module comprising:
    an LED chip;
    a resin case having a frame-like part including a reflective surface formed on an inner side of the resin case to surround the LED chip;
    a mounting member having a mounting surface on which the LED chip is mounted, the frame-like part projecting away from the mounting member;
    a concave-convex area contact inhibitor arranged to reduce a contact area contacting an adjacent LED module, having at least one band-like ridge, and formed on at least a portion of an outer surface of the frame-like part,
    wherein the resin case is made of a resin material including at least one of a silicon resin or a resin containing a silicon resin as a main ingredient, and
    wherein the resin material has a Shore hardness of 50 or less.

16. The LED module of claim 15, wherein the band-like ridge extends away from the mounting surface.

17. The LED module of claim 15, wherein the area contact inhibitor is formed on all outer surfaces of the resin case.

* * * * *